(12) United States Patent
Komiya

(10) Patent No.: US 12,484,367 B2
(45) Date of Patent: Nov. 25, 2025

(54) PHOTOELECTRIC CONVERSION MODULE AND METHOD FOR MANUFACTURING THE SAME

(71) Applicant: ZEON CORPORATION, Tokyo (JP)

(72) Inventor: Ryoichi Komiya, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 237 days.

(21) Appl. No.: 18/260,615

(22) PCT Filed: Feb. 8, 2022

(86) PCT No.: PCT/JP2022/004964
§ 371 (c)(1),
(2) Date: Jul. 7, 2023

(87) PCT Pub. No.: WO2022/181318
PCT Pub. Date: Sep. 1, 2022

(65) Prior Publication Data
US 2024/0057357 A1    Feb. 15, 2024

(30) Foreign Application Priority Data
Feb. 24, 2021    (JP) .................................. 2021-027834

(51) Int. Cl.
*H10K 30/82* (2023.01)
*H10K 30/40* (2023.01)
(Continued)

(52) U.S. Cl.
CPC .......... *H10K 30/821* (2023.02); *H10K 30/89* (2023.02); *H10K 39/12* (2023.02); *H10K 39/18* (2023.02);
(Continued)

(58) Field of Classification Search
CPC ...... H10K 85/50; H10K 30/40; H10K 30/821; H10K 30/84; H10K 30/89; H10K 39/12; H10K 39/18
See application file for complete search history.

(56) References Cited

U.S. PATENT DOCUMENTS 7,854,991 B2    12/2010  Hata et al.
9,799,841 B2    10/2017  Gotanda et al.
(Continued)

FOREIGN PATENT DOCUMENTS

CN    103490011 A  *  1/2014  ............. H10K 30/82
CN    109564979 A       4/2019
(Continued)

OTHER PUBLICATIONS

Machine translation of CN-103490011-A, Meng, Qing-bo. (Year: 2014).*

(Continued)

*Primary Examiner* — Mayla Gonzalez Ramos
(74) *Attorney, Agent, or Firm* — KENJA IP LAW PC

(57) ABSTRACT

A photoelectric conversion module is a photoelectric conversion module including a translucent substrate and one or more photoelectric conversion elements formed on the translucent substrate, wherein each of the photoelectric conversion elements is formed by stacking a transparent conductive film, a first charge transport layer, a power generation layer, and a second charge transport layer made of a porous film containing a carbon material, in this order from the side of the translucent substrate, and a portion of the second charge transport layer of at least one of the photoelectric conversion elements, the portion facing another transparent conductive film adjacent to the transparent conductive film of the photoelectric conversion element is electrically connected to the other transparent conductive film via a conductive layer (Continued)

that is thicker than a thickness of adding up the first charge transport layer and the power generation layer.

10 Claims, 3 Drawing Sheets

(51) Int. Cl.
  *H10K 30/84* (2023.01)
  *H10K 30/89* (2023.01)
  *H10K 39/12* (2023.01)
  *H10K 39/18* (2023.01)
  *H10K 85/50* (2023.01)
(52) U.S. Cl.
  CPC ............ *H10K 85/50* (2023.02); *H10K 30/40* (2023.02); *H10K 30/84* (2023.02)

(56) References Cited

U.S. PATENT DOCUMENTS

| | | | |
|---|---|---|---|
| 11,489,081 B2 | 11/2022 | Amano et al. | |
| 2010/0078060 A1* | 4/2010 | Okada | H01G 9/2081 |
| | | | 136/244 |
| 2011/0315213 A1* | 12/2011 | Takada | H10K 71/50 |
| | | | 257/E31.124 |
| 2012/0298174 A1* | 11/2012 | Suzuki | H10K 39/12 |
| | | | 136/244 |
| 2016/0111575 A1* | 4/2016 | Han | H10K 85/50 |
| | | | 136/258 |
| 2018/0374655 A1* | 12/2018 | Jin | H10F 19/00 |
| 2021/0193929 A1* | 6/2021 | Fujinuma | H10K 39/12 |

FOREIGN PATENT DOCUMENTS

| | | |
|---|---|---|
| JP | 6339037 B2 | 6/2018 |
| JP | 6646471 B2 | 2/2020 |
| WO | 2006011655 A1 | 2/2006 |
| WO | 2020188777 A1 | 9/2020 |

OTHER PUBLICATIONS

Dec. 16, 2024, the Extended European Search Report issued by the European Patent Office in the corresponding European Patent Application No. 22759358.9.

Aug. 29, 2023, International Preliminary Report on Patentability issued in the International Patent Application No. PCT/JP2022/004964.

* cited by examiner

PHOTOELECTRIC CONVERSION MODULE AND METHOD FOR MANUFACTURING THE SAME

TECHNICAL FIELD

This disclosure relates to a photoelectric conversion module and a method for manufacturing the same.

BACKGROUND

Photoelectric conversion elements that convert light energy into electric power, which can be used as solar cells, for example, are known (for example, refer to Patent Literature (PTL) 1). There are various types of solar cells such as perovskite solar cells using perovskite compounds as power generation layers, for example. The photoelectric conversion elements are usually used in the form of photoelectric conversion modules having a translucent substrate and one or more photoelectric conversion elements formed on the translucent substrate (see, for example, Patent Literatures (PTLs) 2 to 3).

CITATION LIST

Patent Literature

PTL 1: JP 6339037 B2
PTL 2: WO 2020188777
PTL 3: JP 6646471 B2

SUMMARY

Technical Problem

However, the conventional photoelectric conversion modules have room for improvement in terms of excellent photoelectric conversion efficiency and ease of manufacture.

It would be helpful to provide a photoelectric conversion module that exhibits excellent photoelectric conversion efficiency and is easy to manufacture, and a method for manufacturing the same.

Solution to Problem

A photoelectric conversion module according to this disclosure is a photoelectric conversion module including a translucent substrate and one or more photoelectric conversion elements formed on the translucent substrate, wherein each of the photoelectric conversion elements is formed by stacking a transparent conductive film, a first charge transport layer, a power generation layer, and a second charge transport layer made of a porous film containing a carbon material, in this order from the side of the translucent substrate, and a portion of the second charge transport layer of at least one of the photoelectric conversion elements, the portion facing another transparent conductive film adjacent to the transparent conductive film of the photoelectric conversion element is electrically connected to the other transparent conductive film via a conductive layer that is thicker than a thickness of adding up the first charge transport layer and the power generation layer. According to such a configuration, the second charge transport layer of at least one of the photoelectric conversion elements can be electrically connected to the other transparent conductive film, while a short circuit can be prevented with the simple structure, thus allowing to provide the photoelectric conversion module that exhibits excellent photoelectric conversion efficiency and is easy to manufacture.

In this disclosure, the term "photoelectric conversion module" means a structure that includes a translucent substrate and one or more photoelectric conversion elements formed on the translucent substrate. The photoelectric conversion module according to this disclosure includes not only those having a plurality of photoelectric conversion elements but also those having only a single photoelectric conversion element. The photoelectric conversion module usually has an external extraction electrode for extracting electric power to the outside, an exterior material for securing strength and the like that are practically required, and the like. However, the photoelectric conversion module according to this disclosure includes those that do not have these external extraction electrode, exterior material, and the like.

Here, in the photoelectric conversion module according to this disclosure, the other transparent conductive film preferably constitutes an external extraction electrode. According to such a configuration, the second charge transport layer of at least one of the photoelectric conversion elements can be electrically connected to the external extraction electrode, while a short circuit can be prevented with the simple structure, thus allowing to enhance the photoelectric conversion efficiency of the photoelectric conversion module and ease of manufacture thereof.

In the photoelectric conversion module according to this disclosure, the other transparent conductive film preferably constitutes a part of the photoelectric conversion element. According to such a configuration, the second charge transport layer of at least one of the photoelectric conversion elements can be electrically connected to a transparent conductive film of another photoelectric conversion element adjacent to the photoelectric conversion element, thus allowing to enhance the photoelectric conversion efficiency of the photoelectric conversion module and ease of manufacture thereof.

In the photoelectric conversion module according to this disclosure, the carbon material preferably includes a carbon nanotube. According to such a configuration, the photoelectric conversion efficiency of the photoelectric conversion module can be enhanced.

In the photoelectric conversion module according to this disclosure, the carbon nanotube preferably includes a single-walled carbon nanotube. According to such a configuration, the photoelectric conversion efficiency of the photoelectric conversion module can be enhanced.

In the photoelectric conversion module according to this disclosure, the conductive layer preferably contains at least one of a carbon material, a metal, or a metal oxide. According to such a configuration, the photoelectric conversion efficiency of the photoelectric conversion module can be enhanced.

In the photoelectric conversion module according to this disclosure, the conductive layer is preferably formed within a surface of the second charge transport layer. According to such a configuration, the photoelectric conversion efficiency of the photoelectric conversion module can be enhanced.

In the photoelectric conversion module according to this disclosure, the conductive layer is preferably formed of a conductive material and an insulating adhesive material. According to such a configuration, the photoelectric conversion efficiency of the photoelectric conversion module can be enhanced.

In the photoelectric conversion module according to this disclosure, the power generation layer preferably contains a perovskite compound. According to such a configuration, the manufacturing cost of the photoelectric conversion module can be reduced, and ease of manufacture of the photoelectric conversion module can be improved.

Furthermore, a method for manufacturing a photoelectric conversion module according to this disclosure is a method for manufacturing a photoelectric conversion module having a translucent substrate and one or more photoelectric conversion elements formed on the translucent substrate, each of the photoelectric conversion elements being formed by stacking a transparent conductive film, a first charge transport layer, a power generation layer, and a second charge transport layer made of a porous film containing a carbon material, in this order from the side of the translucent substrate, the method including the step of electrically connecting a portion of the second charge transport layer of at least one of the photoelectric conversion elements, the portion facing another transparent conductive film adjacent to the transparent conductive film of the photoelectric conversion element, to the other transparent conductive film via a conductive layer that is thicker than a thickness of adding up the first charge transport layer and the power generation layer. According to such a configuration, the second charge transport layer of at least one of the photoelectric conversion elements can be electrically connected to the other transparent conductive film, while a short circuit can be prevented with the simple structure, thus allowing to easily manufacture the photoelectric conversion module that exhibits excellent photoelectric conversion efficiency.

Advantageous Effect

According to this disclosure, it is possible to provide a photoelectric conversion module that exhibits excellent photoelectric conversion efficiency and is easy to manufacture, and a method for manufacturing the same.

DETAILED DESCRIPTION

A photoelectric conversion module according to this disclosure is not particularly limited, and can be used, for example, as a perovskite solar cell module. Hereinafter, an embodiment of the photoelectric conversion module according to this disclosure will be described in detail with reference to the drawings.

(Photoelectric Conversion Module)

Figure 1A:
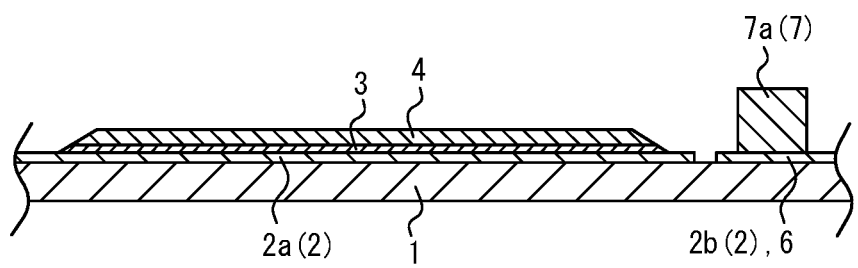
FIG. 1A is a cross-sectional view illustrating a state in the process of manufacturing a photoelectric conversion module according to an embodiment of this disclosure.
Figure 1B:
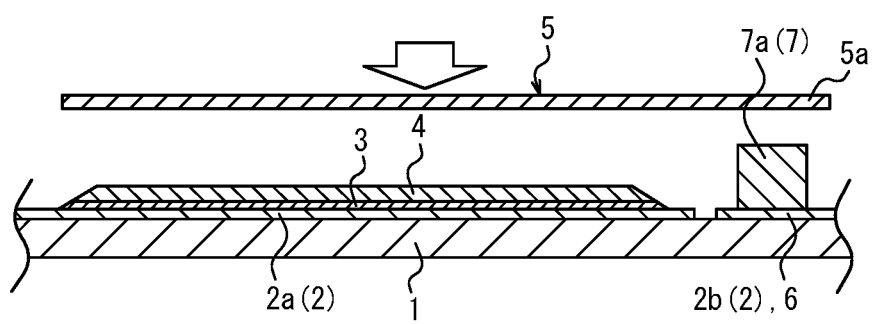
FIG. 1B is a cross-sectional view illustrating a state in which the arrangement of a second charge transport layer is started from the state illustrated in FIG. 1A.
Figure 1C:
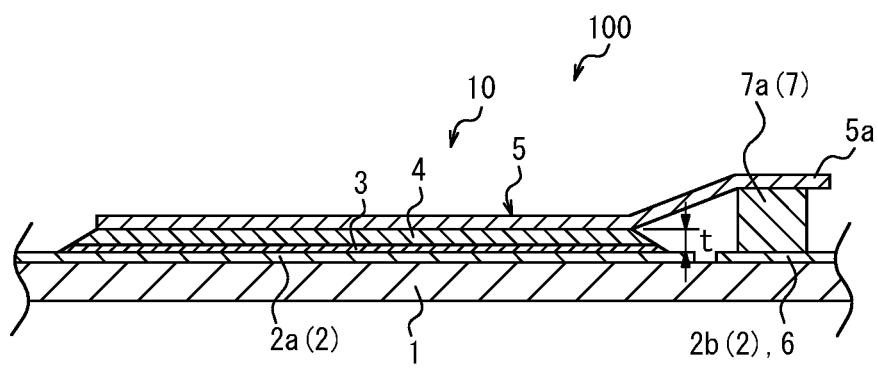
FIG. 1C is a cross-sectional view illustrating a state in which the arrangement of the second charge transport layer is finished from the state illustrated in FIG. 1B.

FIG. 1C illustrates a configuration of a photoelectric conversion module 100 according to an embodiment of this disclosure. FIG. 1A to FIG. 1B illustrate states in the process of manufacturing the photoelectric conversion module 100. As illustrated in 1C, the photoelectric conversion module 100 includes a translucent substrate 1 and one or more photoelectric conversion elements 10 formed on the translucent substrate 1. Each of the photoelectric conversion elements 10 is formed by stacking a transparent conductive film 2, a first charge transport layer 3, a power generation layer 4, and a second charge transport layer 5 made of a porous film containing a carbon material, in this order from the side of the translucent substrate 1. A portion (hereinafter referred to as a facing portion 5a) of the second charge transport layer 5 of at least one of the photoelectric conversion elements 10, the portion 5a facing another transparent conductive film 2 (hereinafter referred to as second transparent conductive film 2b) adjacent to the transparent conductive film 2 (hereinafter referred to as first transparent conductive film 2a) of the photoelectric conversion element 10 is electrically connected to the second transparent conductive film 2b via a conductive layer 7 that is thicker than a thickness t of adding up the first charge transport layer 3 and the power generation layer 4.

Here, the conductive layer 7 can be any conductive layer as long as the conductive layer 7 is capable of forming an electrical connection. As the conductive layer 7, one formed of metal paste such as carbon paste or silver, an adhesive to which conductive fine particles are added, or the like may be used.

By forming the electrical connecting portion via the conductive layer 7 that is thicker than the thickness t, it is possible to prevent the occurrence of a short circuit between the second charge transport layer 5 and the first transparent conductive film 2a when the second charge transport layer 5 made of the porous film containing the carbon material is attached. That is, for example, in a case in which the facing portion 5a of the second charge transport layer 5 is directly bonded to the second transparent conductive film 2b without passing through the conductive layer 7, a short circuit is likely to occur between the second charge transport layer 5 and the first transparent conductive film 2a. However, according to the present embodiment, such a short circuit can be prevented.

In addition, according to the present embodiment, the single second charge transport layer 5 can function as a hole transport layer and function as a current-collecting electrode.

Therefore, according to the present embodiment, the second charge transport layer 5 of at least one of the photoelectric conversion elements 10 can be electrically connected to the second transparent conductive film 2b, while a short circuit can be prevented with the simple structure, thus allowing to provide the photoelectric conversion module 100 that exhibits excellent photoelectric conversion efficiency and is easy to manufacture.

The second transparent conductive film 2b, though not particularly limited, constitutes an external extraction electrode 6 in the present embodiment. Since the second charge transport layer 5 is made of the porous film, it is not preferable to use the second charge transport layer 5 as an external extraction electrode because moisture easily enters from the outside through the porous second charge transport layer 5. Therefore, as in the present embodiment, it is preferable that the second transparent conductive film 2b constitutes the external extraction electrode 6. According to such a configuration, the second charge transport layer 5 of at least one of the photoelectric conversion elements 10 can be electrically connected to the external extraction electrode 6, while a short circuit can be prevented with the simple structure, thus allowing to enhance the photoelectric conversion efficiency of the photoelectric conversion module 100 and ease of manufacture thereof. In addition, it is easy to realize excellent sealing for preventing the entry of moisture from the outside, and thus it is possible to easily realize excellent reliability.

The second transparent conductive film 2b may constitute a part (that is, a transparent conductive film 2) of another photoelectric conversion element (not illustrated) adjacent to the photoelectric conversion element 10 having the first transparent conductive film 2a. According to such a configuration, the second charge transport layer 5 of at least one of the photoelectric conversion elements 10 can be electrically connected to the transparent conductive film 2 of another photoelectric conversion element adjacent to the photoelectric conversion element 10, while a short circuit is prevented with the simple structure, thus allowing to enhance the photoelectric conversion efficiency of the photoelectric conversion module 100 and ease of manufacture thereof.

Figure 3A:
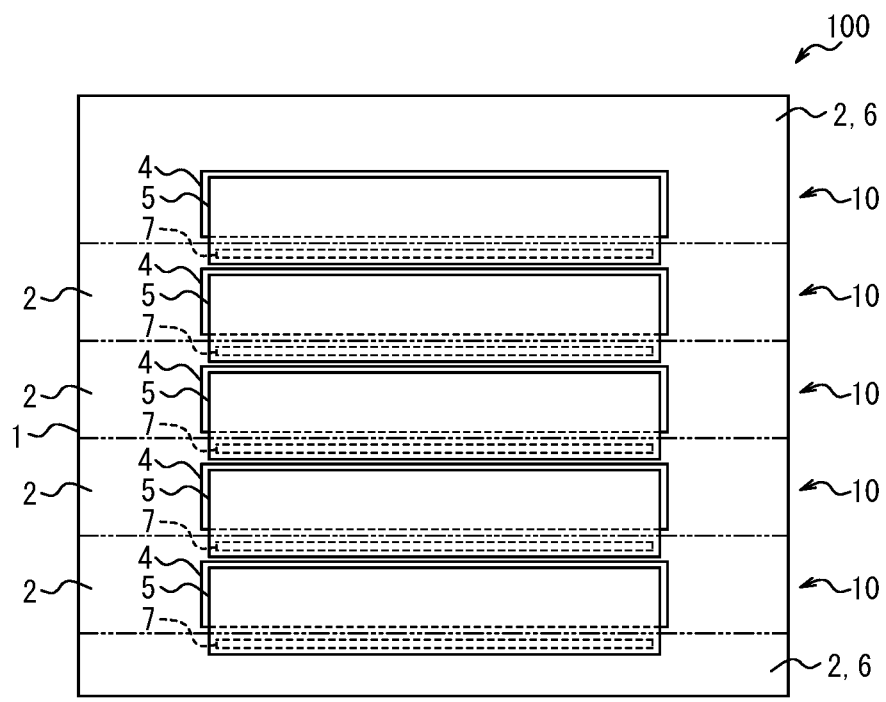
FIG. 3A is a plan view illustrating an example of the connection structure between photoelectric conversion elements in a photoelectric conversion module.
Figure 3B:
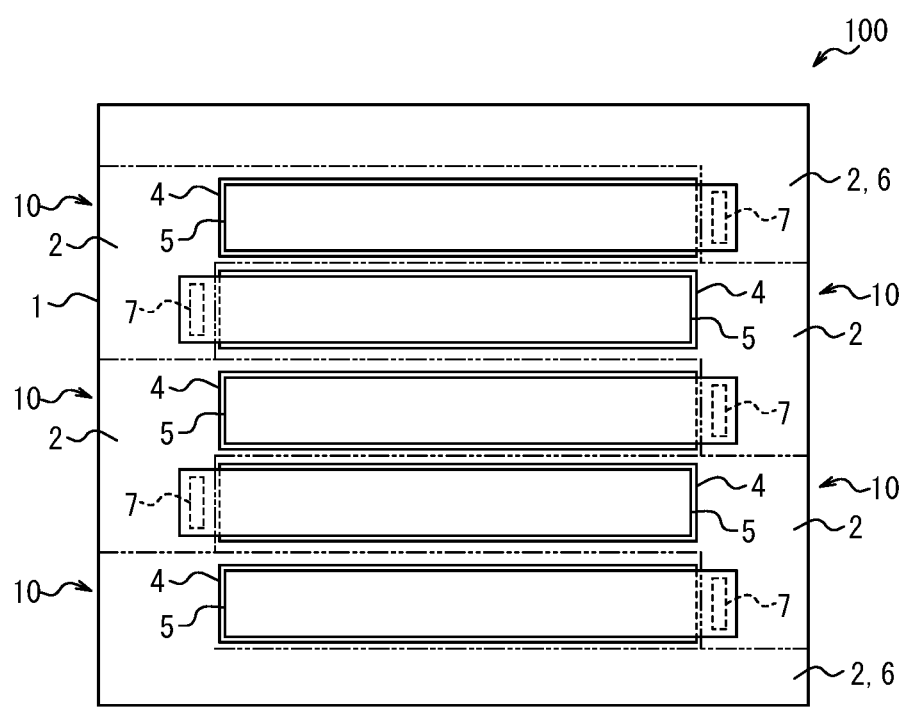
FIG. 3B is a plan view illustrating another example of the connection structure between photoelectric conversion elements in a photoelectric conversion module.

In this case, the conductive layer 7 may be provided between the two photoelectric conversion elements 10 (or power generation layers 4) adjacent to each other, as illustrated in FIG. 3A, for example, or may be provided at a position deviated from between the two photoelectric conversion elements 10 (or power generation layers 4) adjacent to each other, as illustrated in FIG. 3B, for example. In FIG. 3A and FIG. 3B, the two-dot chain lines indicate gaps between the transparent conductive films 2 adjacent to each other (refer to FIG. 1C).

In the present embodiment, for example, as illustrated in FIG. 3A and FIG. 3B, the conductive layer 7 is preferably formed within a surface of the second charge transport layer 5. That is, the entire conductive layer 7 preferably overlaps the second charge transport layer 5 when viewed from a direction perpendicular to the translucent substrate 1. According to such a configuration, it is possible to further prevent a short circuit and thereby enhance the photoelectric conversion efficiency of the photoelectric conversion module 100.

Figure 2A:
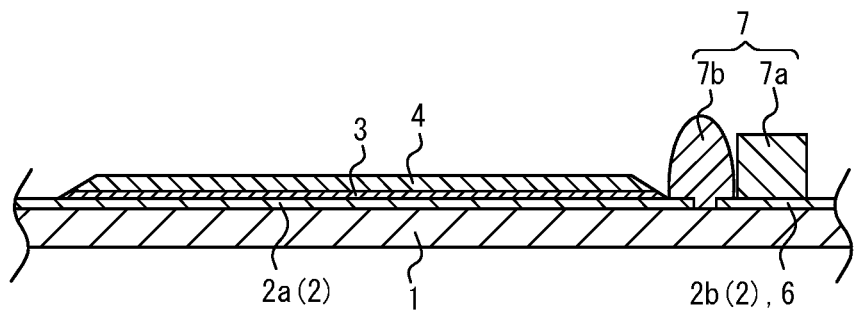
FIG. 2A is a cross-sectional view illustrating a state in the process of manufacturing a variation of the photoelectric conversion module illustrated in FIG. 1.
Figure 2B:
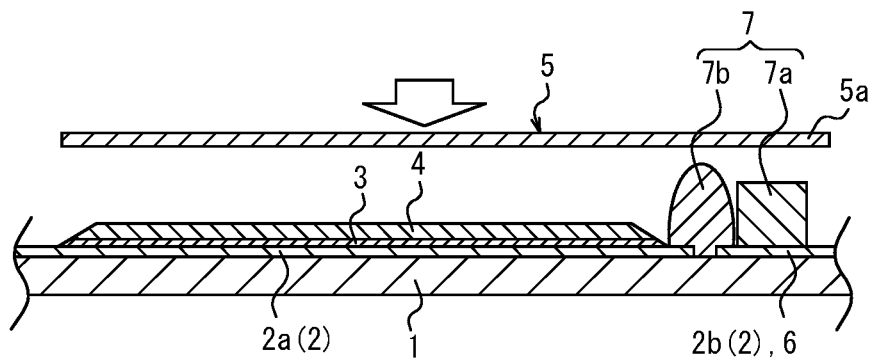
FIG. 2B is a cross-sectional view illustrating a state in which the arrangement of a second charge transport layer is started from the state illustrated in FIG. 2A.
Figure 2C:
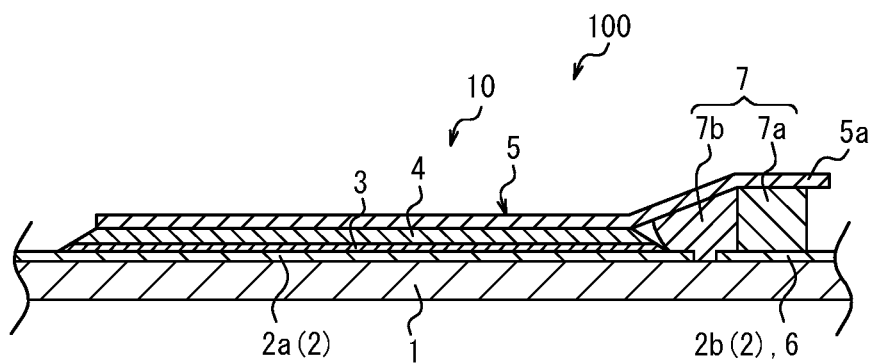
FIG. 2C is a cross-sectional view illustrating a state in which the arrangement of the second charge transport layer is finished from the state illustrated in FIG. 2B.

Further, in the photoelectric conversion module 100 according to the present embodiment, as in a variation illustrated in FIG. 2A to FIG. 2C, the conductive layer 7 is preferably formed of a conductive material 7a and an insulating adhesive material 7b. In this case, the insulating adhesive material 7b can cover a gap between the first transparent conductive film 2a and the second transparent conductive film 2b and an exposed portion of the first transparent conductive film 2a at least partially, so it is possible to further prevent a short circuit, and thus enhance the photoelectric conversion efficiency of the photoelectric conversion module 100.

The conductive layer 7 according to the present embodiment or the conductive material 7a according to the above-described variation preferably contains at least one of a carbon material, a metal, or a metal oxide. According to such a configuration, the photoelectric conversion efficiency of the photoelectric conversion module 100 can be enhanced.

Hereinafter, each of the components constituting the photoelectric conversion element 10 will be described.
<Translucent Substrate 1>

For example, as illustrated in 1C, the translucent substrate 1 constitutes a base body of the photoelectric conversion module 100. The translucent substrate 1 is not particularly limited, and examples thereof include substrates made of glass or synthetic resin, films made of synthetic resin, and the like.

Examples of the glass constituting the translucent substrate 1 include inorganic glass such as soda glass.

Further, examples of the synthetic resin constituting the translucent substrate 1 include, for example, polyacrylic resin, polycarbonate resin, polyester resin, polyimide resin, polystyrene resin, polyvinyl chloride resin, polyamide resin, polycycloolefin resin, and the like. Among these, polyethylene terephthalate (PET) and polyethylene naphthalate (PEN) are preferable as the synthetic resin from the viewpoint of making the photoelectric conversion element 10 thin, light, and flexible.

The thickness of the translucent substrate 1 is not particularly limited, and may be any thickness as long as a shape as the substrate can be maintained. The thickness of the translucent substrate 1 can be, for example, 0.1 mm or more and 10 mm or less.
<Transparent Conductive Film 2>

The transparent conductive film 2 is a film made of a metal oxide formed on a surface of the translucent substrate 1. By providing the transparent conductive film 2, conductivity can be imparted to the surface of the translucent substrate 1.

Examples of the metal oxide constituting the transparent conductive film 2 include fluorine-doped tin oxide (FTO), tin oxide (SnO), indium oxide ($In_2O_3$), tin-doped indium oxide (ITO), zinc oxide (ZnO), indium oxide/zinc oxide (IZO), gallium oxide/zinc oxide (GZO), and the like. The first transparent conductive film 2a and the second transparent conductive film 2b may be formed of the same metal oxide or may be formed of different metal oxides.

The thickness of the transparent conductive film 2 is not particularly limited as long as a desired conductivity can be imparted to the translucent substrate 1. The thickness of the transparent conductive film 2 can be, for example, 1 nm or more and 1 μm or less.
<First Charge Transport Layer 3>

The first charge transport layer 3 is a layer that functions as a charge transport layer, and is preferably composed of an n-type semiconductor. The first charge transport layer 3 is preferably constituted of two layers, a base layer and a porous semiconductor layer, but the first charge transport layer 3 may be one layer composed of an n-type semiconductor.
<Base Layer>

The base layer is a layer optionally provided between the translucent substrate 1 and the porous semiconductor layer. By providing the base layer, the translucent substrate 1 and the transparent conductive film 2 are prevented from directly contacting the porous semiconductor layer. Thereby, loss of electromotive force is prevented, and thus the photoelectric conversion efficiency of the photoelectric conversion element 10 can be improved.

The base layer may be, for example, a porous film or a non-porous dense film, as long as the base layer is composed of an n-type semiconductor. However, from the viewpoint of sufficiently preventing the translucent substrate 1 and the transparent conductive film 2 from contacting the porous semiconductor layer, the base layer is preferably a non-porous dense film. The thickness of the base layer is not particularly limited, and may be, for example, 1 nm or more and 500 nm or less. The base layer may optionally contain an insulating material other than the n-type semiconductor in a proportion that does not impair the properties of the base layer as the n-type semiconductor.

<Porous Semiconductor Layer>

The porous semiconductor layer is a porous layer. The first charge transport layer 3 includes the porous semiconductor layer, so the photoelectric conversion efficiency of the photoelectric conversion element 10 can be improved.

The thickness of the porous semiconductor layer is not particularly limited, but is usually 5 nm or more, preferably 10 nm or more, usually 500 nm or less, and preferably 100 nm or less. The porous semiconductor layer may be formed of one layer or a plurality of layers.

<Power Generation Layer 4>

The power generation layer 4 is a layer made of a material that generates an electromotive force by absorbing light, preferably a layer containing a perovskite compound, and more preferably a layer (perovskite layer) made of a perovskite compound.

The perovskite compound constituting the power generation layer 4 is not particularly limited, and a known perovskite compound can be used. Specifically, examples of the perovskite compound include $CH_3NH_3PbI_3$, $CH_3NH_3PbBr_3$, $(CH_3(CH_2)nCHCH_3NH_3)_2PbI_4$ [n=5 to 8], $(C_6H_5C_2H_4NH_3)_2PbBr_4$, and the like.

The thickness of the power generation layer 4 is not particularly limited, but is preferably 100 nm or more, more preferably 200 nm or more, preferably 1 μm or less, and more preferably 800 nm or less. By setting the thickness of the power generation layer 4 to be 100 nm or more, the electromotive force of the power generation layer 4 can be enhanced.

<Second Charge Transport Layer 5>

The second charge transport layer 5 is a layer made of a porous film containing a carbon material. Here, the carbon material contained in the second charge transport layer 5 is not particularly limited, but preferably contains carbon nanotubes (hereinafter referred to as CNTs). The CNTs contained in the second charge transport layer 5 preferably contain single-walled CNTs. According to such a configuration, the photoelectric conversion efficiency of the photoelectric conversion module 100 can be enhanced.

The second charge transport layer 5 is preferably a layer made of a porous self-supporting sheet. According to such a configuration, the shape stability of the second charge transport layer 5 can be improved, and the photoelectric conversion element 10 can be easily increased in area. Further, by including an ionic compound in the porous self-supporting sheet, the photoelectric conversion efficiency of the photoelectric conversion module 100 can be improved.

In the present embodiment, the porous self-supporting sheet is a sheet in which a plurality of pores is formed, and is a sheet that maintains its shape as a sheet without a support. That is, even when the porous self-supporting sheet is immersed in a predetermined solution, pulled up, and then attached to an object, the shape of the porous self-supporting sheet is maintained without any breakage or the like. Further, the porous self-supporting sheet does not break or deform even when, for example, chlorobenzene or the like, which is a poor solvent with respect to the perovskite compound, is dropped onto the sheet or the sheet is handled with a jig or the like for attaching the sheet. The porous self-supporting sheet preferably maintains its shape as a sheet without a support in size with a thickness of 1 μm to 200 μm and an area of 1 $mm^2$ to 100 $cm^2$.

The porous self-supporting sheet needs to contain at least single-walled CNTs, and is preferably a sheet made of single-walled CNTs, and is more preferably a sheet made of buckypaper. Using the porous self-supporting sheet containing at least single-walled CNTs allows to provide the second charge transport layer 5 with a function as an excellent hole transport layer and a function as a current-collecting electrode.

<<Porous Self-Supporting Sheet>>

The single-walled CNTs contained in the porous self-supporting sheet preferably include single-walled CNTs having the following properties.

—(3σ/Av)—

For the single-walled CNTs contained in the porous self-supporting sheet, a ratio (3σ/Av) of a value (3σ) in which the standard deviation (σ) of a diameter is multiplied by 3 to an average diameter (Av) is preferably greater than 0.20, more preferably greater than 0.25, yet more preferably greater than 0.50, and preferably less than 0.60. When the 3σ/Av is greater than 0.20 and less than 0.60, the second charge transport layer 5 can be provided with a function as a sufficient hole transport layer and a function as a current-collecting electrode, even with a small amount of the single-walled CNTs contained in the porous self-supporting sheet.

"The average diameter (Av) of the single-walled carbon nanotubes" and "the standard deviation (σ: standard deviation) of the diameter of the single-walled carbon nanotubes" can be determined by measuring, using a transmission electron microscope, the diameters (outer diameters) of 100 single-walled carbon nanotubes randomly selected. The average diameter (Av) and the standard deviation (σ) of the single-walled carbon nanotubes may be adjusted by changing a manufacturing method or manufacturing conditions of the single-walled carbon nanotubes, or may be adjusted by combining a plurality of types of single-walled carbon nanotubes obtained by different manufacturing methods.

—Average Diameter (Av) of Single-Walled CNTs—

The average diameter (Av) of the single-walled CNTs is preferably 0.5 nm or more, more preferably 1 nm or more, preferably 15 nm or less, and more preferably 10 nm or less. When the average diameter (Av) of the single-walled CNTs is 0.5 nm or more, the aggregation of the single-walled CNTs is prevented and thus the dispersibility of the single-walled CNTs in the second charge transport layer 5 can be enhanced. When the average diameter (Av) of the single-walled CNTs is 15 nm or less, the second charge transport layer 5 can sufficiently function as a current-collecting electrode.

—T-Plotting—

The single-walled CNTs preferably exhibit an upwardly convex t-plot obtained from an adsorption isotherm. As such single-walled CNTs, single-walled CNTs that are not subjected to aperture treatment are more preferable. By using the single-walled CNTs that exhibit the upwardly convex t-plot obtained from the adsorption isotherm, the second charge transport layer 5 having excellent strength can be obtained.

The inflection point of the t-plot of the single-walled CNTs is preferably within a range of 0.2≤t (nm)≤1.5, more preferably within a range of 0.45≤t (nm)≤1.5, and yet more preferably within a range of 0.55≤t (nm)≤1.0.

The measurement of the adsorption isotherm of the single-walled CNTs, the generation of the t-plot, and the analysis of the t-plot can be performed using, for example, a commercially available measurement tool "BELSORP®

(BELSORP is a registered trademark in Japan, other countries, or both)-mini" (manufactured by Nippon BEL Co., Ltd.).

The single-walled CNTs having the above-described properties can be efficiently manufactured by forming a catalyst layer on a surface of a substrate by a wet process, in a method (super growth method; see WO 2006/011655) in which when a raw material compound and a carrier gas are supplied onto a substrate having a catalyst layer for CNT production on its surface and CNTs are synthesized by a chemical vapor deposition method (CVD method), a trace amount of an oxidizing agent (catalyst activating material) is provided to the system to dramatically improve the catalytic activity of the catalyst layer.

In particular, from the viewpoint of easily obtaining a porous self-supporting sheet having a large film thickness, it is preferable to use, as the single-walled CNTs, single-walled CNTs obtained by the super growth method.

Further, the porous self-supporting sheet preferably contains a material (for example, a perovskite compound) constituting the above-described power generation layer 4 or a part of a material (for example, a material constituting a perovskite compound) constituting the power generation layer 4, inside the porous self-supporting sheet. More specifically, the porous self-supporting sheet preferably contains a material (for example, a perovskite compound) constituting the power generation layer 4 or a part of a material (for example, a material constituting a perovskite compound) constituting the power generation layer, inside a plurality of pores of the porous self-supporting sheet.

The proportion of the single-walled CNTs contained in the porous self-supporting sheet is not particularly limited, but is preferably 50 mass % or more, and preferably 75 mass % or more.

Examples of materials that can be optionally contained in the porous self-supporting sheet, other than the single-walled CNTs, include an organic material or an inorganic material as a p-type semiconductor, and fibrous carbon nanostructures other than the single-walled CNTs.

Examples of the organic material that can be contained in the porous self-supporting sheet include 2,2',7,7'-tetrakis(N,N-di-p-methoxyphenylamino)-9,9'-spirobifluorene (spiro-MeOTAD), poly(3-hexylthiophene) (P3HT), polytriallylamine (PTAA), and the like.

Examples of the inorganic material that can be contained in the porous self-supporting sheet include, for example, CuI, CuSCN, CuO, $Cu_2O$, and the like.

The film thickness of the porous self-supporting sheet is usually preferably 20 μm or more, preferably 30 μm or more, preferably 200 μm or less, and more preferably 80 μm or less. When the film thickness of the porous self-supporting sheet is 20 μm or more and 200 μm or less, the second charge transport layer 5 can exhibit a more excellent function as a current-collecting electrode.

<<Method for Manufacturing Porous Self-Supporting Sheet>>

A method for manufacturing the porous self-supporting sheet is not particularly limited, and for example, a method including the step (film forming step) of forming the porous self-supporting sheet by removing a solvent from fibrous carbon nanostructure dispersion liquid that contains fibrous carbon nanostructures containing at least single-walled CNTs, a dispersant, and the solvent can be employed. Further, the method for manufacturing the porous self-supporting sheet may optionally include, prior to the film forming step, the step (dispersion liquid preparation step) of preparing the fibrous carbon nanostructure dispersion liquid by dispersing crude dispersion liquid that contains fibrous carbon nanostructures containing at least single-walled CNTs, a dispersant, and a solvent.

—Dispersion Liquid Preparation Step—

In the dispersion liquid preparation step, it is preferable that crude dispersion liquid that contains fibrous carbon nanostructures containing at least single-walled CNTs, a dispersant, and a solvent be subjected to a dispersion treatment for obtaining a cavitation effect or a disintegration effect, which is not particularly limited but will be described in detail later, to prepare fibrous carbon nanostructure dispersion liquid by dispersing the fibrous carbon nanostructures containing the single-walled CNTs. As described above, by performing the dispersion treatment for obtaining a cavitation effect or a disintegration effect, the fibrous carbon nanostructure dispersion liquid in which the fibrous carbon nanostructures containing the single-walled CNTs are favorably dispersed can be obtained. When the porous self-supporting sheet is produced using the fibrous carbon nanostructures in which the single-walled CNTs are favorably dispersed, the single-walled CNTs can be uniformly dispersed, thus allowing to obtain a porous self-supporting sheet excellent in properties such as conductivity, thermal conductivity, and mechanical properties. The fibrous carbon nanostructure dispersion liquid used in the manufacture of the porous self-supporting sheet may be prepared by dispersing the fibrous carbon nanostructures containing the single-walled CNTs in a solvent using a known dispersion treatment other than the above.

The fibrous carbon nanostructures used in the preparation of the fibrous carbon nanostructure dispersion liquid may be any fibrous carbon nanostructures as long as the fibrous carbon nanostructures contain at least single-walled CNTs, and may be, for example, a mixture of single-walled CNTs and fibrous carbon nanostructures (for example, multi-walled CNTs) other than the single-walled CNTs.

Here, the fibrous carbon nanostructure dispersion liquid may have a content ratio between the single-walled CNTs and the fibrous carbon nanostructures other than the single-walled CNTs of 50/50 to 75/25 in terms of mass ratio (single-walled CNTs/fibrous carbon nanostructures other than the single-walled CNTs), for example.

=Dispersant=

The dispersant used in the preparation of the fibrous carbon nanostructure dispersion liquid is not particularly limited as long as the dispersant can disperse fibrous carbon nanostructures containing at least single-walled CNTs and can dissolve in a solvent used in the preparation of the fibrous carbon nanostructure dispersion liquid. As such a dispersant, for example, a surfactant, a synthetic polymer, or a natural polymer can be used.

Examples of the surfactant include sodium dodecylsulfonate, sodium deoxycholate, sodium cholate, sodium dodecylbenzenesulfonate, and the like.

Examples of the synthetic polymer include, for example, polyether diols, polyester diols, polycarbonate diols, polyvinyl alcohol, partially saponified polyvinyl alcohol, acetoacetyl group modified polyvinyl alcohol, acetal group modified polyvinyl alcohol, butyral group modified polyvinyl alcohol, silanol group modified polyvinyl alcohol, ethylene-vinyl alcohol copolymer, ethylene-vinyl alcohol-vinyl acetate copolymer resin, dimethylaminoethyl acrylate, dimethylaminoethyl methacrylate, acrylic resins, epoxy resins, modified epoxy resins, phenoxy resins, modified phenoxy resins, phenoxy ether resins, phenoxy ester resins, fluorinated resins, melamine resins, alkyd resins, phenolic resins, polyacrylamide, polyacrylic acid, polystyrenesulfonic acid, polyethylene glycol, polyvinylpyrrolidone, and the like.

Examples of the natural polymer include, for example, polysaccharides such as starch, pullulan, dextran, dextrin, guar gum, xanthan gum, amylose, amylopectin, alginic acid, gum arabic, carrageenan, chondroitin sulfate, hyaluronic acid, cardaran, chitin, chitosan, cellulose, and salts or derivatives thereof. The derivatives refer to conventionally known compounds such as esters and ethers.

These dispersants may be used in a mixture of one kind or two or more kinds. Among these, a surfactant is preferable as the dispersant, and sodium deoxycholate is more preferable as the dispersant because the dispersibility of the fibrous carbon nanostructures containing the single-walled CNTs is excellent.

=Solvent=

The solvent of the fibrous carbon nanostructure dispersion liquid is not particularly limited. Examples of the solvent of the fibrous carbon nanostructure dispersion liquid include, for example, water, alcohols such as methanol, ethanol, n-propanol, isopropanol, n-butanol, isobutanol, t-butanol, pentanol, hexanol, heptanol, octanol, nonanol, decanol, and amyl alcohol, ketones such as acetone, methyl ethyl ketone, and cyclohexanone, esters such as ethyl acetate and butyl acetate, ethers such as diethyl ether, dioxane, and tetrahydrofuran, amide polar organic solvents such as N,N-dimethylformamide and N-methylpyrrolidone, and aromatic hydrocarbons such as toluene, xylene, chlorobenzene, orthodichlorobenzene, and paradichlorobenzene. These may be used alone or in a mixture of two or more.

Then, in the dispersion liquid preparation step, for example, the following dispersion treatment for obtaining a cavitation effect or a disintegration effect is preferably performed.

~Dispersion Treatment for Obtaining Cavitation Effect~

The dispersion treatment for obtaining a cavitation effect is a dispersion method using shock waves caused by rupture of vacuum bubbles generated in water when high energy is applied to liquid. By using this dispersion method, the single-walled CNTs can be favorably dispersed.

Here, specific examples of the dispersion treatment for obtaining a cavitation effect include a dispersion treatment by ultrasonic waves, a dispersion treatment by a jet mill, and a dispersion treatment by high shear stirring. Only one of these dispersion treatments may be performed, or a plurality of dispersion treatments may be performed in combination. More specifically, for example, an ultrasonic homogenizer, a jet mill, and a high shear agitator are preferably used. These devices can be any conventionally known devices.

When the ultrasonic homogenizer is used to disperse the single-walled CNTs, the crude dispersion liquid may be irradiated with ultrasonic waves by the ultrasonic homogenizer. The duration of irradiation may be appropriately set depending on the quantity of the single-walled CNTs or the like, and is, for example, preferably 3 minutes or more, more preferably 30 minutes or more, preferably 5 hours or less, and more preferably 2 hours or less. Further, for example, power is preferably 20 W or more and 500 W or less, and more preferably 100 W or more and 500 W or less. Temperature is preferably 15° C. or more and 50° C. or less.

When the jet mill is used, the number of treatments may be appropriately set depending on the quantity of the single-walled CNTs or the like, and for example, the number of treatments is preferably 2 or more, more preferably 5 or more, preferably 100 or less, and more preferably 50 or less.

Further, for example, pressure is preferably 20 MPa or more and 250 MPa or less, and temperature is preferably 15° C. or more and 50° C. or less.

Furthermore, when the high shear agitation is used, agitation and shear may be added to the crude dispersion liquid by the high shear agitator. The faster the turning speed, the better. For example, the operating time (time during which the machine is rotating) is preferably 3 minutes or more and 4 hours or less. The peripheral speed is preferably 5 m/seconds or more and 50 m/seconds or less. Temperature is preferably 15° C. or more and 50° C. or less.

Note that, the dispersion treatments for obtaining a cavitation effect described above are more preferably performed at temperature of 50° C. or less. This is because concentration change due to volatilization of the solvent is suppressed.

~Dispersion Treatment for Obtaining Disintegration Effect~

The dispersion treatment for obtaining a disintegration effect is, as well as capable of uniformly dispersing the single-walled CNTs in the solvent, more advantageous in that damages to the single-walled CNTs due to shock waves when the bubbles disappear can be prevented, as compared with the above-described dispersion treatment for obtaining a cavitation effect.

In the dispersion treatment for obtaining a disintegration effect, the crude dispersion liquid is subjected to a shearing force to disintegrate and disperse aggregates of the fibrous carbon nanostructures containing the single-walled CNTs, and the crude dispersion liquid is further loaded with a back pressure, and if required, the crude dispersion liquid is cooled, whereby the single-walled CNTs can be uniformly dispersed in the solvent while preventing the generation of bubbles.

In a case in which the back pressure is applied to the crude dispersion liquid, the back pressure applied to the crude dispersion liquid may be lowered all at once to atmospheric pressure, but is preferably lowered in multiple stages.

—Film Forming Step—

In the film forming step, the porous self-supporting sheet is formed by removing the solvent from the fibrous carbon nanostructure dispersion liquid described above. Specifically, in the film forming step, the solvent is removed from the fibrous carbon nanostructure dispersion liquid by using, for example, any of the following methods (A) and (B) to form the porous self-supporting sheet.

(A) A method in which the fibrous carbon nanostructure dispersion liquid is applied to a film-forming substrate and then the applied fibrous carbon nanostructure dispersion liquid is dried.

(B) A method in which the fibrous carbon nanostructure dispersion liquid is filtered using a porous film-forming substrate and the obtained filtrate is dried.

[Film-Forming Substrate]

Here, the film-forming substrate is not particularly limited, and a known substrate can be used.

Specifically, examples of the film-forming substrate to which the fibrous carbon nanostructure dispersion liquid is applied in the method (A) include a resin substrate, a glass substrate, and the like. Examples of the resin substrate include substrates made of polyethylene terephthalate (PET), polyethylene naphthalate (PEN), polytetrafluoroethylene (PTFE), polyimide, polyphenylene sulfide, aramid, polypropylene, polyethylene, polylactic acid, polyvinyl chloride, polycarbonate, polymethyl methacrylate, alicyclic acrylic resin, cyclo-olefin resin, triacetyl cellulose, and the like. Examples of the glass substrate include substrates made of conventional soda glass.

Further, examples of the film-forming substrate for filtering the fibrous carbon nanostructure dispersion liquid in the above method (B) include filter paper, porous sheets made of cellulose, nitrocellulose, or alumina, and the like.

[Application]

As a method for applying the fibrous carbon nanostructure dispersion liquid to the film-forming substrate in the above-described method (A), a known application method can be employed. Specifically, as the application method, dipping, roll coating, gravure coating, knife coating, air knife coating, roll knife coating, die coating, screen printing, spray coating, a gravure offset method, or the like can be employed.

[Filtering]

As a method for filtering the fibrous carbon nanostructure dispersion liquid using the film-forming substrate in the above-described method (B), a known filtering method can be employed. Specifically, as the filtering method, natural filtering, vacuum filtering, pressurized filtering, centrifugal filtering, or the like can be employed.

[Dry]

As a method for drying the fibrous carbon nanostructure dispersion liquid applied to the film-forming substrate in the above method (A) or the filtrate obtained in the above method (B), a known drying method can be employed. Examples of the drying method include hot air drying, vacuum drying, hot roll drying, and an infrared ray irradiation method. Drying temperature is not particularly limited, but is usually from room temperature to 200° C. Drying time is not particularly limited, but is usually from 0.1 to 150 minutes.

<Post-Treatment of Porous Self-Supporting Sheet>

Here, the porous self-supporting sheet formed as described above usually contains components that are contained in the fibrous carbon nanostructure dispersion liquid, such as the single-walled CNTs, the fibrous carbon nanostructures other than the single-walled CNTs, and the dispersant, in the same ratio as the fibrous carbon nanostructure dispersion liquid. Therefore, in the method for manufacturing the porous self-supporting sheet, the porous self-supporting sheet formed in the film forming step may be optionally washed to remove the dispersant from the porous self-supporting sheet. Removing the dispersant from the porous self-supporting sheet can further enhance the properties, such as conductivity, of the porous self-supporting sheet.

The wash of the porous self-supporting sheet can be performed by making the dispersant contact with a dissolvable solvent and eluting the dispersant in the porous self-supporting sheet into the solvent. The solvent capable of dissolving the dispersant in the porous self-supporting sheet is not particularly limited, and the above-described solvent that can be used as a solvent of the fibrous carbon nanostructure dispersion liquid, preferably the same solvent as that of the fibrous carbon nanostructure dispersion liquid can be used. The contact between the porous self-supporting sheet and the solvent can be performed by immersing the porous self-supporting sheet in the solvent or applying the solvent to the porous self-supporting sheet. The washed porous self-supporting sheet can be dried using a known method.

In the manufacture of the porous self-supporting sheet, the porous self-supporting sheet formed in the film forming step may be optionally subjected to adjustment of voids, for example, by further increasing density by press working. From the viewpoint of preventing deterioration in properties due to the damage or breakage of the single-walled CNTs, press pressure at the time of the press working is preferably less than 3 MPa, and it is more preferable that no press working is performed.

Note that each photoelectric conversion element in the photoelectric conversion module according to this disclosure may further include other layers and the like, as long as the photoelectric conversion element is an integrated product of a laminate in which the order of the constituent members described above is maintained, to the extent that the effects of this disclosure are not impaired.

According to the present embodiment, it is possible to provide the photoelectric conversion module 100 that exhibits excellent photoelectric conversion efficiency and is easy to manufacture. Note that, the photoelectric conversion module according to this disclosure is not limited to the above-described configuration, and may include members other than the above-described members, to the extent that the effects of this disclosure are not impaired.

(Method for Manufacturing Photoelectric Conversion Module)

Next, an embodiment of a method for manufacturing a photoelectric conversion module according to this disclosure will be described in detail with reference to the drawings. The method for manufacturing a photoelectric conversion module according to the present embodiment is a method for manufacturing a photoelectric conversion module 100 according to an embodiment of this disclosure described with reference to FIG. 1C.

As illustrated in FIG. 1A to FIG. 1C, the method for manufacturing a photoelectric conversion module according to the present embodiment includes the step (hereinafter, referred to as a connecting step) of electrically connecting a facing portion 5a of a second charge transport layer 5 of at least one of photoelectric conversion elements 10, the facing portion 5a facing a second transparent conductive film 2b adjacent to a first transparent conductive film 2a of the photoelectric conversion element 10, to the second transparent conductive film 2b via a conductive layer 7 that is thicker than a thickness t of adding up a first charge transport layer 3 and a power generation layer 4.

In the method for manufacturing a photoelectric conversion module according to the present embodiment, the second transparent conductive film 2b constitutes an external extraction electrode 6, but this disclosure is not limited to this. The second transparent conductive film 2b may constitute, for example, a part (that is, a transparent conductive film 2) of another photoelectric conversion element (not illustrated) adjacent to the photoelectric conversion element 10 having the first transparent conductive film 2a, as described above. In such a case, as described above, the conductive layer 7 may be arranged as illustrated in FIG. 3A or may be arranged as illustrated in FIG. 3B.

The method for manufacturing a photoelectric conversion module according to the present embodiment can also be applied to the case of manufacturing a variation of the photoelectric conversion module 100 as illustrated in FIG. 2A to FIG. 2C.

Hereinafter, the method for manufacturing a photoelectric conversion module according to the present embodiment will be described in more detail. As respective members of the photoelectric conversion module 100, those listed in the section of "Photoelectric Conversion Module" can be used.

<Preparation of Translucent Substrate 1>

In the method for manufacturing a photoelectric conversion module according to the present embodiment, first, a translucent substrate 1 is prepared.

<Formation of Transparent Conductive Film 2>

Next, a transparent conductive film 2 is formed on the translucent substrate 1. A method for forming the transparent conductive film 2 is not particularly limited, and for example, a known method such as sputtering or evaporation can be employed. Note that, the formation of the transparent conductive film 2 may be omitted by using a commercially available translucent substrate having a transparent conductive film formed on its surface.

<Formation of First Charge Transport Layer 3>

Further, a first charge transport layer 3 is formed on the transparent conductive film 2. The first charge transport layer 3 is obtained, for example, by forming a base layer on the transparent conductive film 2 and then forming a porous semiconductor layer.

[Formation of Base Layer]

A method for forming the base layer is not particularly limited, and can be formed, for example, by spraying a solution containing a material for forming an n-type semiconductor onto the transparent conductive film 2.

Examples of a method for spraying fine particles include spray pyrolysis, aerosol deposition, electrostatic spraying, cold spraying, and the like.

[Formation of Porous Semiconductor Layer]

The method for forming the porous semiconductor layer is not particularly limited, and can be formed by, for example, applying a solution containing a precursor of the n-type semiconductor onto the base layer by spin coating or the like and drying the solution.

Examples of the precursor of the n-type semiconductor include, for example, titanium alkoxides such as titanium tetrachloride ($TiCl_4$), peroxotitanic acid (PTA), titanium ethoxide, and titanium isopropoxide (TTIP); metal alkoxides such as zinc alkoxide, alkoxysilane, zirconium alkoxide, and titanium diisopropoxide bis (acetylacetonate); and the like.

A solvent used in the solution containing the precursor of the n-type semiconductor is not particularly limited, and for example, an alcohol solution such as ethanol can be used.

Further, temperature and time at which the solution applied on the base layer is dried is not particularly limited, and may be appropriately adjusted according to the type of n-type precursor used, the type of solvent, and the like.

<Formation of Power Generation Layer 4>

Then, a power generation layer 4 is formed on the first charge transport layer 3. A method for forming the power generation layer 4 includes vacuum evaporation, coating, and the like, but is not limited to these, and can be formed, for example, by applying a precursor-containing solution containing a precursor of a perovskite compound to the first charge transport layer 3 and baking the precursor-containing solution. Examples of the precursor of the perovskite compound include lead-iodide ($PbI_2$), methylammonium iodide ($CH_3NH_3I$), and the like. A solvent contained in the precursor-containing solution is not particularly limited, and for example, N,N-dimethylformamide, dimethyl sulfoxide, or the like can be used. After applying such a solution, it is also possible to accelerate the precipitation of the perovskite compound using a poor solvent. In this specification, the term "poor solvent" refers to a solvent in which the perovskite compound does not substantially change in a production step. In the production step, it can be said that the perovskite compound does not substantially change unless appearance deterioration such as turbidity of the film is observed by visual observation.

Here, the concentration of the precursor of the perovskite compound in the precursor-containing solution may be appropriately set to an appropriate concentration depending on the solubility or the like of constituent materials of the perovskite compound, and can be, for example, of the order of 0.5 M to 1.5 M.

A method for applying the precursor-containing solution to the first charge transport layer 3 is not particularly limited, and a known applying method such as spin coating, spraying, or bar coating can be employed.

<Connecting Step>

After the power generation layer 4 is formed, a connecting step is performed as illustrated in FIG. 1A to FIG. 1C. In the connecting step, while a second charge transport layer 5 prepared in advance is stacked on the power generation layer 4, a facing portion 5a of the second charge transport layer 5 is electrically connected to a second transparent conductive film 2b via a conductive layer 7 formed in advance. Hereinafter, it will be described in more detail.

<<Formation of Conductive Layer 7>>

Prior to the connecting step, the conductive layer 7 is formed on the second transparent conductive film 2b. The timing of forming the conductive layer 7 is not particularly limited as long as it is before the connection step.

<<Preparation of Second Charge Transport Layer 5>>

Prior to the connecting step, the second charge transport layer 5 is prepared. The timing of preparing the second charge transport layer 5 is not particularly limited as long as it is before the connection step.

<<Attachment of Second Charge Transport Layer 5>>

After the power generation layer 4 and the conductive layer 7 are formed and the second charge transport layer 5 is prepared, as illustrated in FIG. 1B to FIG. 1C, the second charge transport layer 5 is attached to top surfaces of the power generation layer 4 and the conductive layer 7 to perform the connecting step.

The second charge transport layer 5 is attached, for example, by stacking a porous self-supporting sheet on the power generation layer 4 in a state in which a joining surface of at least one of the porous self-supporting sheet, which constitutes the second charge transport layer 5, or the power generation layer 4 holds a solvent (hereinafter, referred to as a solvent X). The porous self-supporting sheet can be thereby efficiently attached to the power generation layer 4. The "joining surface" described above refers to a surface on the side that the power generation layer 4 and the porous self-supporting sheet face to each other. Using the conductive layer 7 that is formed of paste such as carbon or a metal, an adhesive to which conductive fine particles are added, or the like, the porous self-supporting sheet can be attached to the conductive layer 7.

The solvent X is not particularly limited, and examples thereof include poor solvents such as chlorobenzene, toluene, and anisole. By using such a poor solvent, for example, in a case in which the power generation layer 4 is a perovskite layer made of a perovskite compound, the porous self-supporting sheet can be favorably attached to the power generation layer 4.

By using a porous self-supporting sheet impregnated with the solvent X, the solvent X can be favorably held on the joining surface of at least one of the power generation layer 4 or the porous self-supporting sheet.

Here, the porous self-supporting sheet impregnated with the solvent X is obtained, for example, by immersing the porous self-supporting sheet in the solvent X and then pulling up the porous self-supporting sheet. In this case, immersion time is not particularly limited, and may be appropriately set according to the type of solvent to be used.

In a case in which the power generation layer 4 is a perovskite layer, at least one type of precursor of a perovskite compound may be dissolved in the solvent X held on the joining surface of at least one of the power generation layer 4 or the porous self-supporting sheet. For example, a porous self-supporting sheet impregnated with a solution obtained by dissolving at least one type of precursor of the perovskite compound in the solvent X can be used. By forming an interface in which at least one type of precursor of the perovskite compound is present, electric charge can be efficiently transferred between the power generation layer 4 and the second charge transport layer 5 in the obtained photoelectric conversion element 10, and as a result, the photoelectric conversion efficiency can be improved.

The second charge transport layer 5 is preferably attached by hot pressing. Thereby, the photoelectric conversion module 100 in which the integrity of the photoelectric conversion element 10 is improved can be efficiently manufactured. In this case, heating temperature is not particularly limited, but can be appropriately selected from a range of room temperature to 200° C., based on the boiling point of the solvent X and temperatures with little effect on the perovskite layer. Pressing time is not particularly limited, but is usually 1 second to 10 minutes. Pressure at the time of heat pressing is not particularly limited as long as the pressure does not affect the substrate or the formed films, and may be, for example, 0.01 to 0.5 MPa. Further, in heat pressing, the porous self-supporting sheet is preferably pressed in such a manner as to ensure a volatile path for the solvent in order to promote removal of a solvent component contained in the porous self-supporting sheet. Specifically, in order to ensure the volatile path for the solvent, for example, heat pressing is preferably performed through a member having voids, such as a thick wipe, a porous rubber, a porous metal, or a porous ceramic.

According to the above-described manufacturing method, the photoelectric conversion module 100 that exhibits excellent photoelectric conversion efficiency can be easily manufactured. Note that, a method for manufacturing a photoelectric conversion element according to this disclosure is not limited to the above-described method, and may include other steps than the above-described steps to the extent that the effects of this disclosure are not impaired.

EXAMPLES

Hereinafter, this disclosure will be described in detail based on Examples, but this disclosure is not limited to these Examples.

Ten photoelectric conversion modules were manufactured in each of Examples and Comparative Examples, and battery performance, a short-circuit number, and reliability were evaluated. The photoelectric conversion modules manufactured in each of Examples and Comparative Examples are photoelectric conversion modules that have a translucent substrate and one (Examples 1 and 2, Comparative Examples 1 and 2) or two (Example 3) photoelectric conversion elements formed on the translucent substrate, but the number (hereinafter, referred to as series number) of photoelectric conversion elements electrically connected in series can be appropriately selected according to applications.

<Battery Performance>

As a light source, a solar simulator (WXS-90S-L2, AM 1.5 GMM, manufactured by Wacom Electric Co., Ltd.) was used. The light source was adjusted to 1 sun [AM 1.5 G, 100 mW/cm$^2$ (JIS C8912 Class-A)]. The manufactured photoelectric conversion module was connected to a source meter (Type 6244 DC voltage/current source, manufactured by ADC Corporation), and the following current-voltage characteristic was measured.

Under the light irradiation of 1 sun, output current was measured while a bias voltage was varied in voltage by selecting a measurement range according to the number of series. The measurement of the output current was performed by integrating values from 0.5 seconds to 0.6 seconds, after the voltage was changed in each voltage step.

From the measurement results of the above current-voltage characteristic, short-circuit current density (mA/cm$^2$), open-circuit voltage (V), form factor, and photoelectric conversion efficiency (%) were calculated. Each characteristic in Table 1 indicates an average value of the photoelectric conversion modules excluding those short-circuited.

<Short-Circuit Number>

The short-circuit number is the number of photoelectric conversion modules, out of the 10 photoelectric conversion modules manufactured, having a short circuit in the photoelectric conversion element. In the evaluation of the battery performance, a photoelectric conversion module indicating a significantly low voltage (half of the open-circuit voltage of the other photoelectric conversion modules) was assumed to be short-circuited.

<Reliability>

The manufactured photoelectric conversion modules were stored at 45° C. in a 90% RH constant temperature and humidity chamber for 300 hours, and a performance retention ratio after the storage with respect to before the storage was evaluated.

Example 1

<Preparation of Translucent Substrate on which Transparent Conductive Films are Formed>

A conductive glass substrate (manufactured by Sigma-Aldrich, thickness: 2.2 mm) with a fluorine doped tin (FTO) film (thickness: 600 nm), as a transparent conductive film, on a surface of the glass substrate was used, and a part of the FTO film was removed by etching. Thereby, a translucent substrate (hereinafter referred to as "transparent conductive substrate") with two divided transparent conductive films (FTO films) was obtained.

<Formation of First Charge Transport Layer>

A solution (manufactured by Sigma-Aldrich) of titanium diisopropoxide bis (acetylacetonate) dissolved in isopropanol was sprayed onto a surface of the transparent conductive film (FTO film) of the transparent conductive substrate by spray pyrolysis. At this time, a strip of a glass sheet was placed to form a base layer at a predetermined position. Thereby, the base layer (TiO$_2$ dense layer, a thickness of 30 nm) made of titanium dioxide was formed. Next, a solution of titanium dioxide paste (manufactured by Sigma-Aldrich) diluted with ethanol was prepared. The obtained solution was applied to a surface of the base layer by spin coating, dried on a hot plate at 120° C. for 10 minutes, wiped off an applied film protruding from the base layer in plan view, and then heat treated at a temperature of 450° C. for 30 minutes. Thereby, a porous semiconductor layer (TiO$_2$ porous layer, a thickness of 120 nm, the average particle diameter of TiO$_2$ particles: 20 nm) was formed to obtain a first charge transport layer.

<Formation of Power Generation Layer>

An N,N-dimethylformamide (DMF) solution containing lead iodide (PbI$_2$) at a concentration of 1.0 M and methylammonium iodide (CH$_3$NH$_3$I) at a concentration of 1.0 M was prepared as a solution (1) containing a precursor of a perovskite compound. The obtained solution (1) was applied to a surface of the first charge transport layer by spin coating with a drop of chlorobenzene, followed by baking at a temperature of 100° C. for 10 minutes to form a perovskite layer (a thickness of 450 nm), as a power generation layer. Subsequently, the perovskite layer protruding from a portion to be the power generation layer was removed to obtain a power generation layer forming substrate.

<Preparation of Porous Film (CNT Film) Containing Carbon Material>

A porous film (CNT film) containing single-walled CNTs as a carbon material was prepared according to the following steps.

To 500 mL of a 2 mass % aqueous solution of sodium deoxycholate (DOC), as a solvent containing dispersant, 1.0 g of single-walled CNTs (SGCNTs) (product name "ZEO-NANO SG101" manufactured by ZEON Corporation, average diameter (Av): 3.5 nm, G/D ratio: 2.1, t-plot is convex on top due to no aperture treatment) were added as fibrous carbon nanostructures containing single-walled CNTs, to obtain crude dispersion liquid containing DOC as a dispersant. The crude dispersion liquid was charged into a high-pressure homogenizer (product name "BERYU SYSTEM PRO" manufactured by BERYU Corporation) with a multi-stage pressure control device (multi-stage pressure reducer) that loads back pressure during dispersion, and the crude dispersion liquid was subjected to dispersion treatment at a pressure of 100 MPa. Specifically, while applying back pressure, shear force was applied to the crude dispersion liquid to disperse fibrous carbon nanostructures containing single-walled CNTs, so fibrous carbon nanostructure dispersion liquid containing single-walled CNTs was obtained. The dispersion treatment was carried out for 10 minutes while returning the dispersion liquid that flowed out of the high-pressure homogenizer to the high-pressure homogenizer again.

To a 200-mL beaker, 50 g of the prepared fibrous carbon nanostructure dispersion liquid containing the single-walled CNTs was added, and 50 g of distilled water was added to make a 2-fold dilution, and filtration was performed under 0.09 MPa conditions using a vacuum filtering device with a membrane filter. After the filtration, a CNT film formed on the membrane filter was washed by passing respective isopropyl alcohol and water through the vacuum filtering device, and then air was passed through for 15 minutes. The prepared CNT film/membrane filter was then immersed in ethanol to peel the CNT film from the membrane filter to obtain a CNT film (A), as a porous film containing a carbon material.

The obtained CNT film (A) was the same size as the membrane filter, had excellent film formation properties, and maintained its film state even after being peeled off from the filter, thus having excellent self-supporting properties. The film density of the obtained CNT film (A) was measured by volume and weight determined from a film thickness using a contact-type step meter, and the density was 0.85 g/cm$^3$. The CNT film (A), as a porous film containing a carbon material, had a thickness of 20 μm when not pressurized in the thickness direction, as measured according to the method described above.

<Formation of Conductive Layer>

A conductive layer was formed by applying conductive paste (DOTITE manufactured by FUJIKURA KASEI Co., Ltd.) to a predetermined portion on a surface of the transparent conductive film that would constitute an external extraction electrode.

<Formation of Second Charge Transport Layer>

After the CNT film (A) cut into a predetermined size was immersed in toluene for 10 seconds, the CNT film (A) was pulled up from the toluene to obtain a chlorobenzene-impregnated CNT film (1). Then, the CNT film (1) was stacked on the power generation layer on the above-described power generation layer forming substrate heated on a hot plate at a temperature of 100° C., and the obtained laminate was pressed (hot-pressed) from the side of the CNT film (1) to a thickness direction at a pressure of 0.05 Pa to form a second charge transport layer. At this time, the thickness of a conductive layer was 6 μm.

<Formation of Exterior Material>

Thereafter, a glass sheet, as an exterior material for sealing the photoelectric conversion element from the outside, was adhered to the translucent substrate to form a photoelectric conversion module. At this time, adhesive (TB3035B manufactured by ThreeBond Co., Ltd.) was applied so that portions of the transparent conductive films that would constitute external extraction electrodes protrude outside, and then the exterior material was overlayed and cured by UV light for sealing. Then, power was collected from the photoelectric conversion element through the two external extraction electrodes constituted of the divided transparent conductive films, and battery performance and a performance retention ratio were measured. Table 1 indicates the results.

Example 2

A photoelectric conversion module was manufactured in the same manner as in Example 1, except that, as the conductive layer of the photoelectric conversion module of Example 1, "Micropearl AU" (conductive fine particles with gold plated on surfaces, typical shape: spherical, volume average particle diameter: 1.0 μm) manufactured by SEKISUI CHEMICAL Co., Ltd. was added as conductive fine particles to "TB3035B" (manufactured by ThreeBond Co., Ltd.) as an acrylic resin being an adhesive material, to make up 13.5 mass %, and mixed uniformly with a planetary centrifugal mixer. Measurements were performed using the obtained photoelectric conversion module, as in Example 1. Table 1 indicates the results.

Example 3

<Preparation of Translucent Substrate on which Transparent Conductive Films are Formed>

A conductive glass substrate (manufactured by Sigma-Aldrich, thickness: 2.2 mm) with a fluorine doped tin (FTO) film (thickness: 600 nm), as a transparent conductive film, on a surface of the glass substrate was used, and a part of the FTO film was removed by etching. Thereby, a translucent substrate (hereinafter referred to as "transparent conductive substrate") with three divided transparent conductive films (FTO films) was obtained.

<Formation of First Charge Transport Layers>

A solution (manufactured by Sigma-Aldrich) of titanium diisopropoxide bis (acetylacetonate) dissolved in isopropanol was sprayed onto surfaces of the transparent conductive films (FTO films) of the transparent conductive substrate by spray pyrolysis. At this time, strips of glass sheets were placed to form base layers at predetermined positions on the two transparent conductive films adjacent to each other. Thereby, the base layers (TiO$_2$ dense layers, a thickness of 30 nm) made of titanium dioxide were formed. Next, a solution of titanium dioxide paste (manufactured by Sigma-Aldrich) diluted with ethanol was prepared. The obtained solution was applied to a surface of each base layer by spin coating, dried on a hot plate at 120° C. for 10 minutes, wiped off an applied film protruding from each base layer in plan view, and then heat treated at a temperature of 450° C. for 30 minutes. Thereby, porous semiconductor layers (TiO$_2$ porous layers, a thickness of 120 nm, the average particle diameter of TiO$_2$ particles: 20 nm) were formed to obtain first charge transport layers.

<Formation of Power Generation Layers>

An N,N-dimethylformamide (DMF) solution containing lead iodide (PbI$_2$) at a concentration of 1.0 M and methylammonium iodide (CH$_3$NH$_3$I) at a concentration of 1.0 M was prepared as a solution (1) containing a precursor of a perovskite compound. The obtained solution (1) was applied to a surface of each of the first charge transport layers by spin coating with a drop of chlorobenzene, followed by baking at a temperature of 100° C. for 10 minutes to form perovskite layers (a thickness of 450 nm), as power generation layers. Subsequently, the perovskite layers protruding from portions to be the power generation layers were removed to obtain power generation layer forming substrates.

Thereafter, a photoelectric conversion module was manufactured in the same manner as in Example 1 for the preparation of porous films, the formation of second charge transport layers on the respective power generation layers, and the formation of an exterior material. Measurements were performed using the obtained photoelectric conversion module, as in Example 1. Table 1 indicates the results.

Comparative Example 1

A photoelectric conversion module was manufactured in the same manner as in Example 1, except that, after a second charge transport layer was formed without forming a conductive layer, conductive paste was applied on the top of the second charge transport layer to connect the second charge transport layer to an adjacent transparent conductive film, thus making a series connection. Measurements were performed using the obtained photoelectric conversion module, as in Example 1. Table 1 indicates the results.

Comparative Example 2

A photoelectric conversion module was manufactured in the same manner as in Example 1, except that a CNT film, which serves as a second charge transport layer, was constituted of a portion extended to the outside of a sealing portion (adhesive for adhering an exterior material). Measurements were performed using the obtained photoelectric conversion module, as in Example 1. Table 1 indicates the results.

INDUSTRIAL APPLICABILITY

According to this disclosure, it is possible to provide a photoelectric conversion module that exhibits excellent photoelectric conversion efficiency and is easy to manufacture, and a method for manufacturing the same.

REFERENCE SIGNS LIST 1 translucent substrate
2 transparent conductive film
2a first transparent conductive film
2b second transparent conductive film
3 first charge transport layer
4 power generation layer
5 second charge transport layer
5a facing portion
6 external extraction electrode
7 conductive layer
7a conductive material
7b insulating adhesive material
10 photoelectric conversion element
100 photoelectric conversion module

The invention claimed is:

1. A photoelectric conversion module comprising:
a translucent substrate; and
one or more photoelectric conversion elements formed on the translucent substrate,
wherein
each of the photoelectric conversion elements is formed by stacking a transparent conductive film, a first charge transport layer, a power generation layer, and a second charge transport layer made of a porous film containing a carbon material, in this order from a side of the translucent substrate, and
a portion of the second charge transport layer of at least one of the photoelectric conversion elements, the portion facing another transparent conductive film adjacent to the transparent conductive film of the photoelectric conversion element, is electrically connected to the other transparent conductive film via a conductive layer that is thicker than a thickness of adding up the first charge transport layer and the power generation layer so that a spacing between the transparent conductive film and the second charge transport layer is larger than a spacing between the other transparent conductive film and the second charge transport layer.

TABLE 1

|  | Example 1 | Example 2 | Example 3 | Comparative Example 1 | Comparative Example 2 |
| --- | --- | --- | --- | --- | --- |
| Short-circuit current density [mA/cm2] | 15.32 | 15.18 | 7.12 | 15.22 | 14.93 |
| Open-circuit voltage [V] | 0.795 | 0.798 | 1.652 | 0.794 | 0.799 |
| Form factor | 0.765 | 0.741 | 0.705 | 0.761 | 0.770 |
| Photoelectric conversion efficiency [%] | 9.32 | 8.98 | 8.29 | 9.20 | 9.19 |
| Short-circuit number | 0 | 0 | 0 | 2 | 1 |
| Reliability [%] | 98 | 100 | 99 | 97 | 47 |

It is apparent from the results in Table 1 that, according to Examples 1 to 3, photoelectric conversion modules with excellent photoelectric conversion efficiency that are less likely to have short circuits can be manufactured, and excellent reliability can be obtained by achieving excellent sealing from the outside.

2. The photoelectric conversion module according to claim 1, wherein the other transparent conductive film constitutes an external extraction electrode.

3. The photoelectric conversion module according to claim 1, wherein the other transparent conductive film constitutes a part of the photoelectric conversion element.

4. The photoelectric conversion module according to claim 1, wherein the carbon material includes a carbon nanotube.

5. The photoelectric conversion module according to claim 4, wherein the carbon nanotube includes a single-walled carbon nanotube.

6. The photoelectric conversion module according to claim 1, wherein the conductive layer contains at least one of a carbon material, a metal, or a metal oxide.

7. The photoelectric conversion module according to claim 1, wherein the conductive layer overlaps the second charge transport layer when viewed from a direction perpendicular to the translucent substrate.

8. The photoelectric conversion module according to claim 1, wherein the conductive layer is formed of a conductive material and an insulating adhesive material.

9. The photoelectric conversion module according to claim 1, wherein the power generation layer contains a perovskite compound.

10. A method for manufacturing a photoelectric conversion module having a translucent substrate and one or more photoelectric conversion elements formed on the translucent substrate, each of the photoelectric conversion elements being formed by stacking a transparent conductive film, a first charge transport layer, a power generation layer, and a second charge transport layer made of a porous film containing a carbon material, in this order from a side of the translucent substrate, the method comprising the step of electrically connecting a portion of the second charge transport layer of at least one of the photoelectric conversion elements, the portion facing another transparent conductive film adjacent to the transparent conductive film of the photoelectric conversion element, to the other transparent conductive film via a conductive layer that is thicker than a thickness of adding up the first charge transport layer and the power generation layer so that a spacing between the transparent conductive film and the second charge transport layer is larger than a spacing between the other transparent conductive film and the second charge transport layer.

* * * * *